(12) United States Patent
Barnes et al.

(10) Patent No.: US 9,074,170 B2
(45) Date of Patent: Jul. 7, 2015

(54) COPPER CLEANING AND PROTECTION FORMULATIONS

(75) Inventors: Jeffrey A. Barnes, Bethlehem, CT (US); Brian Benac, Marble Falls, TX (US); Karl E. Boggs, Hopewell Junction, NY (US); Lin Feng, Orange, CT (US); Jun Liu, Brookfield, CT (US); Melissa A. Petruska, Newtown, CT (US); Xiaodong Yan, New Milford, CT (US); Peng Zhang, Montvale, NJ (US)

(73) Assignee: ADVANCED TECHNOLOGY MATERIALS, INC., Danbury, CT (US)

( * ) Notice: Subject to any disclaimer, the term of this patent is extended or adjusted under 35 U.S.C. 154(b) by 106 days.

(21) Appl. No.: 13/124,942

(22) PCT Filed: Oct. 20, 2009
(Under 37 CFR 1.47)

(86) PCT No.: PCT/US2009/061263
§ 371 (c)(1),
(2), (4) Date: Oct. 11, 2011

(87) PCT Pub. No.: WO2010/048139
PCT Pub. Date: Apr. 29, 2010

(65) Prior Publication Data
US 2012/0283163 A1    Nov. 8, 2012

Related U.S. Application Data

(60) Provisional application No. 61/107,319, filed on Oct. 21, 2008, provisional application No. 61/118,221, filed on Nov. 26, 2008.

(51) Int. Cl.
*C11D 11/00* (2006.01)
*C11D 1/72* (2006.01)
(Continued)

(52) U.S. Cl.
CPC .............. *C11D 11/0047* (2013.01); *C11D 1/72* (2013.01); *C11D 3/042* (2013.01); *C11D 3/245* (2013.01); *C11D 3/30* (2013.01); *C11D 3/33* (2013.01)

(58) Field of Classification Search
CPC .................................................. C11D 11/0047
USPC .................................................. 510/175, 176
See application file for complete search history.

(56) References Cited

U.S. PATENT DOCUMENTS

| 4,776,892 A | 10/1988 | Steppan et al. |
| 5,174,816 A | 12/1992 | Aoyama et al. |

(Continued)

FOREIGN PATENT DOCUMENTS

| EP | 0773480 A1 | 5/1997 |
| EP | 1263300 A0 | 12/2002 |

(Continued)

OTHER PUBLICATIONS

International Bureau of WIPO, International Search Report, dated Jun. 1, 2010.

(Continued)

*Primary Examiner* — Gregory Webb
(74) *Attorney, Agent, or Firm* — Tristan A. Fuierer; Moore & Van Allen, PLLC; Rosa Yaghmour (57) ABSTRACT

A cleaning composition and process for cleaning post-chemical mechanical polishing (CMP) residue and contaminants from a microelectronic device having said residue and contaminants thereon. The cleaning compositions include novel corrosion inhibitors. The composition achieves highly efficacious cleaning of the post-CMP residue and contaminant material from the surface of the microelectronic device without compromising the low-k dielectric material or the copper interconnect material.

22 Claims, 1 Drawing Sheet

(51) Int. Cl.
  *C11D 3/04* (2006.01)
  *C11D 3/24* (2006.01)
  *C11D 3/30* (2006.01)
  *C11D 3/33* (2006.01)

(56) References Cited

U.S. PATENT DOCUMENTS

| | | | |
|---|---|---|---|
| 5,308,745 | A | 5/1994 | Schwartzkopf |
| 5,466,297 | A | 11/1995 | Goodman et al. |
| 5,466,389 | A | 11/1995 | Ilardi et al. |
| 5,489,557 | A | 2/1996 | Jolley |
| 5,498,293 | A | 3/1996 | Ilardi et al. |
| 5,563,119 | A | 10/1996 | Ward |
| 5,567,574 | A | 10/1996 | Hasemi et al. |
| 5,571,447 | A | 11/1996 | Ward et al. |
| 5,597,420 | A | 1/1997 | Ward |
| 5,855,811 | A | 1/1999 | Grieger et al. |
| 5,962,384 | A | 10/1999 | Cooper et al. |
| 5,981,454 | A | 11/1999 | Small |
| 5,988,186 | A | 11/1999 | Ward et al. |
| 5,989,353 | A | 11/1999 | Skee et al. |
| 5,997,658 | A | 12/1999 | Peters et al. |
| 6,030,932 | A | 2/2000 | Leon et al. |
| 6,143,705 | A | 11/2000 | Kakizawa et al. |
| 6,194,366 | B1 | 2/2001 | Naghshineh et al. |
| 6,228,823 | B1 | 5/2001 | Morinaga et al. |
| 6,395,693 | B1 | 5/2002 | Wang |
| 6,410,494 | B2 | 6/2002 | Kakizawa et al. |
| 6,413,923 | B2 | 7/2002 | Honda et al. |
| 6,440,326 | B1 | 8/2002 | Maruyama |
| 6,492,308 | B1 | 12/2002 | Naghshineh et al. |
| 6,514,434 | B1 | 2/2003 | He et al. |
| 6,514,921 | B1 | 2/2003 | Kakizawa et al. |
| 6,541,434 | B2 | 4/2003 | Wang |
| 6,585,825 | B1 | 7/2003 | Skee |
| 6,599,370 | B2 | 7/2003 | Skee |
| 6,627,587 | B2 | 9/2003 | Naghshineh et al. |
| 6,646,082 | B2 | 11/2003 | Ghosh et al. |
| 6,723,691 | B2 | 4/2004 | Naghshineh et al. |
| 6,749,998 | B2 | 6/2004 | Schwartzkopf et al. |
| 6,786,945 | B2 | 9/2004 | Machii et al. |
| 6,787,480 | B2 | 9/2004 | Aoki et al. |
| 6,869,921 | B2 | 3/2005 | Koito et al. |
| 6,982,188 | B1 | 1/2006 | Xie et al. |
| 6,992,050 | B2 | 1/2006 | Koita et al. |
| 7,087,564 | B2 | 8/2006 | Misra et al. |
| 7,118,685 | B1 | 10/2006 | Yoneda et al. |
| 7,160,432 | B2 | 1/2007 | Liu et al. |
| 7,235,188 | B2 | 6/2007 | Daviot et al. |
| 7,250,391 | B2 | 7/2007 | Kanno et al. |
| 7,365,045 | B2 | 4/2008 | Walker et al. |
| 7,375,066 | B2 | 5/2008 | Kakizawa et al. |
| 7,476,620 | B2 | 1/2009 | Siddiqui et al. |
| 7,563,754 | B2 | 7/2009 | Oowada et al. |
| 7,671,001 | B2 * | 3/2010 | Skee .................. 510/175 |
| 7,723,280 | B2 | 5/2010 | Brainard et al. |
| 2002/0077259 | A1 | 6/2002 | Skee |
| 2003/0096500 | A1 | 5/2003 | Kneer |
| 2003/0158059 | A1 | 8/2003 | Sakai et al. |
| 2004/0020568 | A1 | 2/2004 | Phelps et al. |
| 2004/0180300 | A1 | 9/2004 | Minsek et al. |
| 2004/0220065 | A1 | 11/2004 | Hsu |
| 2005/0112892 | A1 | 5/2005 | Chen et al. |
| 2005/0197265 | A1 | 9/2005 | Rath et al. |
| 2005/0205835 | A1 | 9/2005 | Tamboli et al. |
| 2005/0206005 | A1 | 9/2005 | Buehler |
| 2005/0284844 | A1 | 12/2005 | Hattori |
| 2006/0016785 | A1 | 1/2006 | Egbe et al. |
| 2006/0019201 | A1 | 1/2006 | Muramatsu |
| 2006/0063692 | A1 | 3/2006 | Forst |
| 2006/0073997 | A1 | 4/2006 | Leonte et al. |
| 2006/0148666 | A1 | 7/2006 | Peters et al. |
| 2006/0166847 | A1 | 7/2006 | Walker et al. |
| 2008/0004197 | A1 | 1/2008 | Kneer |
| 2008/0076688 | A1 | 3/2008 | Barnes et al. |
| 2009/0118153 | A1 * | 5/2009 | Rath et al. ............... 510/176 |
| 2009/0239777 | A1 | 9/2009 | Angst et al. |
| 2010/0056409 | A1 * | 3/2010 | Walker et al. .............. 510/175 |
| 2010/0056410 | A1 * | 3/2010 | Visintin et al. ............. 510/176 |
| 2010/0261632 | A1 * | 10/2010 | Korzenski et al. ........... 510/175 |

FOREIGN PATENT DOCUMENTS

| | | |
|---|---|---|
| JP | 63274149 A | 11/1988 |
| JP | 07201794 A | 8/1995 |
| JP | 07247498 A | 9/1995 |
| JP | 08202052 A | 8/1996 |
| JP | 11271985 A | 8/1999 |
| JP | 2002069495 | 3/2002 |
| JP | 2002097584 | 4/2002 |
| JP | 2002099101 A | 5/2002 |
| JP | 2008060377 | 3/2008 |
| KR | 1020060113906 A | 11/2006 |
| WO | 9408276 A1 | 4/1994 |
| WO | 9816330 A1 | 4/1998 |
| WO | 9960448 A1 | 11/1999 |
| WO | 0160179 A1 | 8/2001 |
| WO | 2007092800 A2 | 8/2007 |
| WO | 2007110719 | 10/2007 |

OTHER PUBLICATIONS

International Searching Authority, International Preliminary Report on Patentability, dated May 5, 2011.
Taiwanese Office Action, Apr. 18, 2014.
Japanese Office Action, Nov. 27, 2013 (English Translation also enclosed).
Japanese Office Action, Nov. 20, 2014.

* cited by examiner

COPPER CLEANING AND PROTECTION FORMULATIONS

CROSS-REFERENCE TO RELATED APPLICATIONS

This application is filed under the provisions of 35 U.S.C. §371 and claims the priority of International Patent Application No. PCT/US09/61263 filed on 20 Oct. 2009 and entitled "Copper Cleaning and Protection Formulations" which claims priority to U.S. Provisional Patent Application No. 61/107,319 filed on 21 Oct. 2008 and U.S. Provisional Patent Application No. 61/118,221 filed on 26 Nov. 2008, all of which are hereby incorporated herein by reference in their entireties.

FIELD

The present invention relates generally to compositions including corrosion inhibitors for cleaning residue and/or contaminants from microelectronic devices having same thereon.

DESCRIPTION OF THE RELATED ART

Microelectronic device wafers are used to form integrated circuits. The microelectronic device wafer includes a substrate, such as silicon, into which regions are patterned for deposition of different materials having insulative, conductive or semi-conductive properties.

In order to obtain the correct patterning, excess material used in forming the layers on the substrate must be removed. Further, to fabricate functional and reliable circuitry, it is important to prepare a flat or planar microelectronic wafer surface prior to subsequent processing. Thus, it is necessary to remove and/or polish certain surfaces of a microelectronic device wafer.

Chemical Mechanical Polishing or Planarization ("CMP") is a process in which material is removed from a surface of a microelectronic device wafer, and the surface is polished (more specifically, planarized) by coupling a physical process such as abrasion with a chemical process such as oxidation or chelation. In its most rudimentary form, CMP involves applying slurry, e.g., a solution of an abrasive and an active chemistry, to a polishing pad that buffs the surface of a microelectronic device wafer to achieve the removal, planarization, and polishing processes. It is not desirable for the removal or polishing process to be comprised of purely physical or purely chemical action, but rather the synergistic combination of both in order to achieve fast, uniform removal. In the fabrication of integrated circuits, the CMP slurry should also be able to preferentially remove films that comprise complex layers of metals and other materials so that highly planar surfaces can be produced for subsequent photolithography, or patterning, etching and thin-film processing.

Recently, copper has been increasingly used for metal interconnects in integrated circuits. In copper damascene processes commonly used for metallization of circuitry in microelectronic device fabrication, the layers that must be removed and planarized include copper layers having a thickness of about 1-1.5 µm and copper seed layers having a thickness of about 0.05-0.15 µm. These copper layers are separated from the dielectric material surface by a layer of barrier material, typically about 50-300 Å thick, which prevents diffusion of copper into the oxide dielectric material. One key to obtaining good uniformity across the wafer surface after polishing is to use a CMP slurry that has the correct removal selectivities for each material.

The foregoing processing operations, involving wafer substrate surface preparation, deposition, plating, etching and chemical mechanical polishing, variously require cleaning operations to ensure that the microelectronic device product is free of contaminants that would otherwise deleteriously affect the function of the product, or even render it useless for its intended function. Often, particles of these contaminants are smaller than 0.3 µm.

One particular issue in this respect is the residues that are left on the microelectronic device substrate following CMP processing. Such residues include CMP material and corrosion inhibitor compounds such as benzotriazole (BTA). If not removed, these residues can cause damage to copper lines or severely roughen the copper metallization, as well as cause poor adhesion of post-CMP applied layers on the device substrate. Severe roughening of copper metallization is particularly problematic, since overly rough copper can cause poor electrical performance of the product microelectronic device.

Another residue-producing process common to microelectronic device manufacturing involves gas-phase plasma etching to transfer the patterns of developed photoresist coatings to the underlying layers, which may consist of hardmask, interlevel dielectric (ILD), and etch stop layers. Post-gas phase plasma etch residues, which may include chemical elements present on the substrate and in the plasma gases, are typically deposited on the back end of the line (BEOL) structures and if not removed, may interfere with subsequent silicidation or contact formation. Conventional cleaning chemistries often damage the ILD, absorb into the pores of the ILD thereby increasing the dielectric constant, and/or corrode the metal structures.

SUMMARY

The present invention generally relates to a composition and process for cleaning residue and/or contaminants from microelectronic devices having said residue and contaminants thereon. The cleaning compositions of the invention include at least one novel corrosion inhibitor. The residue may include post-CMP, post-etch, and/or post-ash residue.

In one aspect, a cleaning composition is described, said cleaning composition comprising at least one solvent, at least one corrosion inhibitor, at least one amine, and at least one quaternary base, wherein the corrosion inhibitor comprises a species selected from the group consisting of ribosylpurines and methylated or deoxy derivatives thereof; degradation products of adenosine and adenosine derivatives; purine-saccharide complexes; methylated or deoxy purine derivatives, and reaction or degradation products thereof; and combinations thereof.

In another aspect, a kit is described, said kit comprising, in one or more containers, one or more of the following reagents for forming a cleaning composition, wherein the cleaning composition comprises at least one solvent, at least one corrosion inhibitor, at least one amine, and at least one quaternary base, wherein the corrosion inhibitor comprises a species selected from the group consisting of: ribosylpurines and methylated or deoxy derivatives thereof; degradation products of adenosine and adenosine derivatives; purine-saccharide complexes; methylated or deoxy purine derivatives, and reaction or degradation products thereof; and combinations thereof.

In still another aspect, a method of removing residue and contaminants from a microelectronic device having said residue and contaminants thereon is described, said method comprising contacting the microelectronic device with a cleaning composition for sufficient time to at least partially clean said residue and contaminants from the microelectronic device, wherein the cleaning composition includes at least one solvent, at least one corrosion inhibitor, at least one amine, and at least one quaternary base, wherein the corrosion inhibitor comprises a species selected from the group consisting of: ribosylpurines and methylated or deoxy derivatives thereof; degradation products of adenosine and adenosine derivatives; purine-saccharide complexes; methylated or deoxy purine derivatives, and reaction or degradation products thereof; and combinations thereof.

Other aspects, features and advantages will be more fully apparent from the ensuing disclosure and appended claims.

DETAILED DESCRIPTION, AND PREFERRED EMBODIMENTS THEREOF

The present invention relates generally to compositions useful for the removal of residue and contaminants from a microelectronic device having such material(s) thereon. The compositions are particularly useful for the removal of post-CMP, post-etch or post-ash residue.

For ease of reference, "microelectronic device" corresponds to semiconductor substrates, flat panel displays, phase change memory devices, solar panels and other products including solar substrates, photovoltaics, and microelectromechanical systems (MEMS), manufactured for use in microelectronic, integrated circuit, or computer chip applications. Solar substrates include, but are not limited to, silicon, amorphous silicon, polycrystalline silicon, monocrystalline silicon, CdTe, copper indium selenide, copper indium sulfide, and gallium arsenide on gallium. The solar substrates may be doped or undoped. It is to be understood that the term "microelectronic device" is not meant to be limiting in any way and includes any substrate that will eventually become a microelectronic device or microelectronic assembly.

As used herein, "residue" corresponds to particles generated during the manufacture of a microelectronic device including, but not limited to, plasma etching, ashing, chemical mechanical polishing, wet etching, and combinations thereof.

As used herein, "contaminants" correspond to chemicals present in the CMP slurry, reaction by-products of the polishing slurry, chemicals present in the wet etching composition, reaction by products of the wet etching composition, and any other materials that are the by-products of the CMP process, the wet etching, the plasma etching or the plasma ashing process.

As used herein, "post-CMP residue" corresponds to particles from the polishing slurry, e.g., silica-containing particles, chemicals present in the slurry, reaction by-products of the polishing slurry, carbon-rich particles, polishing pad particles, brush deloading particles, equipment materials of construction particles, copper, copper oxides, organic residues, and any other materials that are the by-products of the CMP process.

As defined herein, "low-k dielectric material" corresponds to any material used as a dielectric material in a layered microelectronic device, wherein the material has a dielectric constant less than about 3.5. Preferably, the low-k dielectric materials include low-polarity materials such as silicon-containing organic polymers, silicon-containing hybrid organic/inorganic materials, organosilicate glass (OSG), TEOS, fluorinated silicate glass (FSG), silicon dioxide, and carbon-doped oxide (CDO) glass. It is to be appreciated that the low-k dielectric materials may have varying densities and varying porosities.

As defined herein, "complexing agent" includes those compounds that are understood by one skilled in the art to be complexing agents, chelating agents and/or sequestering agents. Complexing agents will chemically combine with or physically hold the metal atom and/or metal ion to be removed using the compositions described herein.

As defined herein, the term "barrier material" corresponds to any material used in the art to seal the metal lines, e.g., copper interconnects, to minimize the diffusion of said metal, e.g., copper, into the dielectric material. Preferred barrier layer materials include tantalum, titanium, ruthenium, hafnium, tungsten, and other refractory metals and their nitrides and silicides.

As defined herein, "post-etch residue" corresponds to material remaining following gas-phase plasma etching processes, e.g., BEOL dual damascene processing, or wet etching processes. The post-etch residue may be organic, organometallic, organosilicic, or inorganic in nature, for example, silicon-containing material, carbon-based organic material, and etch gas residue such as oxygen and fluorine.

As defined herein, "post-ash residue," as used herein, corresponds to material remaining following oxidative or reductive plasma ashing to remove hardened photoresist and/or bottom anti-reflective coating (BARC) materials. The post-ash residue may be organic, organometallic, organosilicic, or inorganic in nature.

"Substantially devoid" is defined herein as less than 2 wt. %, preferably less than 1 wt. %, more preferably less than 0.5 wt. %, and most preferably less than 0.1 wt. %.

As used herein, "about" is intended to correspond to ±5% of the stated value.

As defined herein, "reaction or degradation products" include, but are not limited to, product(s) or byproduct(s) formed as a result of catalysis at a surface, oxidation, reduction, reactions with the compositional components, or that otherwise polymerize; product(s) or byproduct(s) formed formed as a result of a change(s) or transformation(s) in which a substance or material (e.g., molecules, compounds, etc.) combines with other substances or materials, interchanges constituents with other substances or materials, decomposes, rearranges, or is otherwise chemically and/or physically altered, including intermediate product(s) or byproduct(s) of any of the foregoing or any combination of the foregoing reaction(s), change(s) and/or transformation(s). It should be appreciated that the reaction or degradation products may have a larger or smaller molar mass than the original reactant.

As used herein, "suitability" for cleaning residue and contaminants from a microelectronic device having said residue and contaminants thereon corresponds to at least partial removal of said residue/contaminants from the microelectronic device. Cleaning efficacy is rated by the reduction of objects on the microelectronic device. For example, pre- and post-cleaning analysis may be carried out using an atomic force microscope. The particles on the sample may be registered as a range of pixels. A histogram (e.g., a Sigma Scan Pro) may be applied to filter the pixels in a certain intensity, e.g., 231-235, and the number of particles counted. The particle reduction may be calculated using:

$$\text{Cleaning Efficacy} = \frac{(\text{Number of PreClean Objects} - \text{Number of PostClean Objects})}{\text{Number of PreClean Objects}} \times 100$$

Notably, the method of determination of cleaning efficacy is provided for example only and is not intended to be limited to same. Alternatively, the cleaning efficacy may be considered as a percentage of the total surface that is covered by particulate matter. For example, AFM's may be programmed to perform a z-plane scan to identify topographic areas of interest above a certain height threshold and then calculate the area of the total surface covered by said areas of interest. One skilled in the art would readily understand that the less area covered by said areas of interest post-cleaning, the more efficacious the cleaning composition. Preferably, at least 75% of the residue/contaminants are removed from the microelectronic device using the compositions described herein, more preferably at least 90%, even more preferably at least 95%, and most preferably at least 99% of the residue/contaminants are removed.

Compositions described herein may be embodied in a wide variety of specific formulations, as hereinafter more fully described.

In all such compositions, wherein specific components of the composition are discussed in reference to weight percentage ranges including a zero lower limit, it will be understood that such components may be present or absent in various specific embodiments of the composition, and that in instances where such components are present, they may be present at concentrations as low as 0.001 weight percent, based on the total weight of the composition in which such components are employed.

The cleaning compositions include at least one corrosion inhibitor, where the corrosion inhibitor component is added to the cleaning composition to lower the corrosion rate of metals, e.g., copper, aluminum, as well as enhance the cleaning performance. Corrosion inhibitors contemplated include, but are not limited to: ribosylpurines such as N-ribosylpurine, adenosine, guanosine, 2-aminopurine riboside, 2-methoxyadenosine, and methylated or deoxy derivatives thereof, such as N-methyladenosine ($C_{11}H_{15}N_5O_4$), N,N-dimethyladenosine ($C_{12}H_{17}N_5O_4$), trimethylated adenosine ($C_{13}H_{19}N_5O_4$), trimethyl N-methyladenosine ($C_{14}H_{21}N_5O_4$), C-4'-methyladenosine, and 3-deoxyadenosine; degradation products of adenosine and adenosine derivatives including, but not limited to, adenine ($C_5H_5N_5$), methylated adenine (e.g., N-methyl-7H-purin-6-amine, $C_6H_7N_5$), dimethylated adenine (e.g., N,N-dimethyl-7H-purin-6-amine, $C_7H_9N_5$), N4,N4-dimethylpyrimidine-4,5,6-triamine($C_6H_{11}N_5$), 4,5,6-triaminopyrimidine, allantoin ($C_4H_6N_4O_3$), hydroxylated C—O—O—C dimers (($C_5H_4N_5O_2$)$_2$), C—C bridged dimers (($C_5H_4N_5$)$_2$ or ($C_5H_4N_5O$)$_2$), ribose ($C_5H_{10}O_5$), methylated ribose (e.g., 5-(methoxymethyl)tetrahydrofuran-2,3,4-triol, $C_6H_{12}O_5$), tetramethylated ribose (e.g., 2,3,4-trimethoxy-5-(methoxymethyetetrahydrofuran, $C_9H_{18}O_5$), and other ribose derivatives such as methylated hydrolyzed diribose compounds; purine-saccharide complexes including, but not limited to, xylose, glucose, etc.; other purine compounds such as purine, guanine, hypoxanthine, xanthine, theobromine, caffeine, uric acid, and isoguanine, and methylated or deoxy derivatives thereof; triaminopyrimidine and other substituted pyrimidines such as amino-substituted pyrimidines; dimers, trimers or polymers of any of the compounds, reaction or degradation products, or derivatives thereof; and combinations thereof. For example, the corrosion inhibitors may comprise at least one species selected from the group consisting of N-ribosylpurine, 2-aminopurine riboside, 2-methoxyadenosine, N-methyladenosine, N,N-dimethyladenosine, trimethylated adenosine, trimethyl N-methyladenosine, C-4'-methyladenosine, 3-deoxyadenosine; methylated adenine, dimethylated adenine, N4,N4-dimethylpyrimidine-4,5,6-triamine, 4,5,6-triaminopyrimidine, hydroxylated C—O—O—C dimers, C—C bridged dimers, ribose, methylated ribose, tetramethylated ribose, xylose, glucose, isoguanine, triaminopyrimidine, amino-substituted pyrimidines, and combinations thereof. Alternatively, the corrosion inhibitors may include at least one species selected from the group consisting of 2-methoxyadenosine, N-methyladenosine, N,N-dimethyladenosine, trimethylated adenosine, trimethyl N-methyladenosine, C-4'-methyladenosine, 3-deoxyadenosine and combinations thereof. In another alternative, the corrosion inhibitor comprises adenosine. In yet another alternative, the corrosion inhibitor comprises adenine. In still another alternative, the corrosion inhibitor include adenosine degradation products and derivatives thereof. As disclosed, combinations of the corrosion inhibitors are also contemplated, for example, adenine in combination with a purine.

In one embodiment, a cleaning composition is described, wherein said cleaning composition comprises at least one solvent and at least one corrosion inhibitor. Preferably, the solvent comprises water, and more preferably deionized water.

In a further embodiment the cleaning composition comprises, consists of, or consists essentially of at least one corrosion inhibitor, at least one quaternary base, at least one organic amine, at least one solvent (e.g., water), and optionally at least one additional species selected from the group consisting of at least one reducing agent, at least one complexing agent, at least one supplemental corrosion inhibitor, at least one alcohol, at least one surfactant, and $NR^1R^2R^3R^4OH$, where $R^1$, $R^2$, $R^3$ and $R^4$ can be the same as or different from one another and are selected from the group consisting of H, a methyl and an ethyl group, with the proviso that at least one of $R^1$, $R^2$, $R^3$ and $R^4$ must be H. In another embodiment, the at least one additional species is selected from the group consisting of at least one reducing agent, at least one complexing agent, at least one supplemental corrosion inhibitor, at least one alcohol, at least one surfactant, and $NR^1R^2R^3R^4OH$, where $R^1$, $R^2$, $R^3$ and $R^4$ can be the same as or different from one another and are selected from the group consisting of H, a methyl and an ethyl group, with the proviso that at least one of $R^1$, $R^2$, $R^3$ and $R^4$ must be H, wherein the cleaning composition is substantially devoid of surfactant.

In a particularly preferred embodiment, the cleaning composition comprises, consists of or consists essentially of at least one quaternary base, at least one organic amine, at least one corrosion inhibitor, and at least one solvent (e.g., water), wherein the corrosion inhibitor is selected from the group consisting of adenosine, adenosine degradation products, and derivatives thereof. The cleaning composition may optionally further comprise at least one reducing agent, at least one complexing agent, at least one supplemental corrosion inhibitor, at least one alcohol, at least one surfactant, and $NR^1R^2R^3R^4OH$ (as defined above), residue material, or combinations thereof.

In a further preferred embodiment, a composition comprising, consisting of, or consisting essentially of at least one quaternary base, at least one organic amine, at least one corrosion inhibitor, and at least one solvent is described, wherein the corrosion inhibitor includes at least one of:

(1) at least one compound selected from the group consisting of ribosylpurine compounds, methylated or deoxy derivatives of purine, purine-saccharide complexes, derivatives thereof, and combinations thereof;

(2) at least one reaction or degradation product mixture resulting from the breakdown/degradation of at least one compound in (1) after contacting said compound with an aqueous solution containing the at least one quaternary base and the at least one amine;

(3) at least one compound selected from the group consisting of N-ribosylpurine, 2-aminopurine riboside, 2-methoxyadenosine, N-methyladenosine, N,N-dimethyladenosine, trimethylated adenosine, trimethyl N-methyladenosine, C-4'-methyladenosine, 3-deoxyadenosine; methylated adenine, dimethylated adenine, N4,N4-dimethylpyrimidine-4,5,6-triamine, 4,5,6-triaminopyrimidine, hydroxylated C—O—O—C dimers, C—C bridged dimers, ribose, methylated ribose, tetramethylated ribose, xylose, glucose, isoguanine, triaminopyrimidine, amino-substituted pyrimidines, and combinations thereof;

(4) at least one compound selected from the group consisting of 2-methoxyadenosine, N-methyladenosine, N,N-dimethyladenosine, trimethylated adenosine, trimethyl N-methyladenosine, C-4'-methyladenosine, 3-deoxyadenosine and combinations thereof;

(5) adenosine;

(6) adenine;

(7) at least one compound selected from the group consisting of ribosylpurine compounds and methylated or deoxy derivatives thereof, purine-saccharide complexes, derivatives thereof, and combinations thereof; and/or (8) degradation products of adenosine and adenosine derivatives.

The cleaning compositions may optionally further comprise at least one reducing agent, at least one complexing agent, at least one supplemental corrosion inhibitor, at least one alcohol, at least one surfactant, and $NR^1R^2R^3R^4OH$ (as defined above), residue material, or combinations thereof.

The cleaning composition is particularly useful for cleaning residue and contaminants, e.g., post-CMP residue, post-etch residue, post-ash residue, and contaminants from a microelectronic device structure. Regardless of the embodiment, the cleaning compositions are preferably substantially devoid of at least one of oxidizing agents; fluoride-containing sources; abrasive materials; an alcohol having an ether-bond in the molecule; alkylpyrrolidones; surface interaction enhancing agents including, but not limited to, poly(acrylamide-co-diallyldiemethylammonium chloride), poly(acrylamide), poly(acrylic acid), poly(diallyldiemethylammonium chloride), diallyldimethylammonium chloride, acrylamide, acetoguanamine, and combinations thereof; alkali and/or alkaline earth metal bases; sugar alcohols; corrosion inhibiting metal halides; and combinations thereof, prior to removal of residue material from the microelectronic device. In addition, the cleaning compositions should not solidify to form a polymeric solid, for example, photoresist.

The cleaning compositions may further include supplemental corrosion inhibitors, in addition to the corrosion inhibitors enumerated above, including, but not limited to, ascorbic acid, L(+)-ascorbic acid, isoascorbic acid, ascorbic acid derivatives, benzotriazole, citric acid, ethylenediamine, gallic acid, oxalic acid, tannic acid, 1,2,4-triazole (TAZ), tolyltriazole, 5-phenyl-benzotriazole, 5-nitro-benzotriazole, 3-amino-5-mercapto-1,2,4-triazole, 1-amino-1,2,4-triazole, hydroxybenzotriazole, 2-(5-amino-pentyl)-benzotriazole, 1,2,3-triazole, 1-amino-1,2,3-triazole, 1-amino-5-methyl-1,2,3-triazole, 3-amino-1,2,4-triazole, 3-mercapto-1,2,4-triazole, 3-isopropyl-1,2,4-triazole, 5-phenylthiol-benzotriazole, halo-benzotriazoles (halo=F, Cl, Br or I), naphthotriazole, 2-mercaptobenzimidazole (MBI), 2-mercaptobenzothiazole, 4-methyl-2-phenylimidazole, 2-mercaptothiazoline, 5-aminotetrazole, 5-amino-1,3,4-thiadiazole-2-thiol, 2,4-diamino-6-methyl-1,3,5-triazine, thiazole, triazine, methyltetrazole, 1,3-dimethyl-2-imidazolidinone, 1,5-pentamethylenetetrazole, 1-phenyl-5-mercaptotetrazole, diaminomethyltriazine, imidazoline thione, mercaptobenzimidazole, 4-methyl-4H-1,2,4-triazole-3-thiol, 5-amino-1,3,4-thiadiazole-2-thiol, benzothiazole, tritolyl phosphate, imidazole, indiazole, benzoic acid, ammonium benzoate, catechol, pyrogallol, resorcinol, hydroquinone, cyanuric acid, barbituric acid and derivatives such as 1,2-dimethylbarbituric acid, alpha-keto acids such as pyruvic acid, phosphonic acid and derivatives thereof such as 1-hydroxyethylidene-1,1-diphosphonic acid (HEDP), propanethiol, benzohydroxamic acids, heterocyclic nitrogen inhibitors, potassium ethylxanthate, and combinations thereof. For example, the cleaning compositions may include the combination of phenanthroline and ascorbic acid or glycine and ascorbic acid. In another preferred embodiment, the cleaning compositions include 1,2,4-triazole. In still another preferred embodiment, the cleaning compositions comprises HEDP.

Illustrative amines that may be useful in specific compositions include species having the general formula $NR^1R^2R^3$, wherein $R^1$, $R^2$ and $R^3$ may be the same as or different from one another and are selected from the group consisting of hydrogen, straight-chained or branched $C_1$-$C_6$ alkyl (e.g., methyl, ethyl, propyl, butyl, pentyl, and hexyl), straight-chained or branched $C_1$-$C_6$ alcohol (e.g., methanol, ethanol, propanol, butanol, pentanol, and hexanol), and straight chained or branched ethers having the formula $R^4$—O—$R^5$, where $R^4$ and $R^5$ may be the same as or different from one another and are selected from the group consisting of $C_1$-$C_6$ alkyls as defined above. Most preferably, at least one of $R^1$, $R^2$ and $R^3$ is a straight-chained or branched $C_1$-$C_6$ alcohol. Examples include, without limitation, alkanolamines such as aminoethylethanolamine, N-methylaminoethanol, aminoethoxyethanol, dimethylaminoethoxyethanol, diethanolamine, N-methyldiethanolamine, monoethanolamine, triethanolamine, 1-amino-2-propanol, 2-amino-1-butanol, isobutanolamine, triethylenediamine, other $C_1$-$C_8$ alkanolamines and combinations thereof. When the amine includes the ether component, the amine may be considered an alkoxyamine, e.g., 1-methoxy-2-aminoethane. Alternatively, or in addition to the $NR^1R^2R^3$ amine, the amine may be a multi-functional amine including, but not limited to, tetraethylenepentamine (TEPA), 4-(2-hydroxyethyl)morpholine (HEM), N-aminoethylpiperazine (N-AEP), ethylenediaminetetraacetic acid (EDTA), 1,2-cyclohexanediamine-N,N,N',N'-tetraacetic acid (CDTA), glycine/ascorbic acid, iminodiacetic acid (IDA), 2-(hydroxyethyl)iminodiacetic acid (HIDA), nitrilotriacetic acid, thiourea, 1,1,3,3-tetramethylurea, urea, urea derivatives, uric acid, glycine, alanine, arginine, asparagine, aspartic acid, cysteine, glutamic acid, glutamine, histidine, isoleucine, leucine, lysine, methionine, phenylalanine, proline, serine, threonine, tryptophan, tyrosine, valine, and combinations thereof. Preferably, the amines include at least one species selected from the group consisting of monoethanolamine, triethanolamine, EDTA, CDTA, HIDA, and N-AEP.

Quaternary bases contemplated herein include compounds having the formula $NR^1R^2R^3R^4OH$, wherein $R^1$, $R^2$, $R^3$ and $R^4$ may be the same as or different from one another and are selected from the group consisting of hydrogen, straight-chained or branched $C_1$-$C_6$ alkyl (e.g., methyl, ethyl, propyl, butyl, pentyl, and hexyl), and substituted or unsubstituted $C_6$-$C_{10}$ aryl, e.g., benzyl. Tetraalkylammonium hydroxides that are commercially available include tetraethylammonium hydroxide (TEAH), tetramethyammonium hydroxide (TMAH), tetrapropylammonium hydroxide (TPAH), tetrabutylammonium hydroxide (TBAH), tributylmethylammonium hydroxide (TBMAH), benzyltrimethylammonium hydroxide (BTMAH), and combinations thereof, may be used. Tetraalkylammonium hydroxides which are not commercially available may be prepared in a manner analogous to the published synthetic methods used to prepare TMAH, TEAH, TPAH, TBAH, TBMAH, and BTMAH, which are known to one ordinary of skill in the art. Another widely used quaternary ammonium base is choline hydroxide. Although not a quaternary base, it is contemplated that the bases cesium hydroxide or rubidium hydroxide may be used in the absence of or the presence of the above-identified quaternary bases. Preferably, the quaternary base comprises TMAH.

Reducing agent(s) contemplated herein include species selected from the group consisting of ascorbic acid, L(+)-ascorbic acid, isoascorbic acid, ascorbic acid derivatives, gallic acid, glyoxal, and combinations thereof. In a particularly preferred embodiment, the cleaning composition includes ascorbic acid. In another particularly preferred embodiment, the cleaning composition includes ascorbic acid and gallic acid.

Illustrative alcohols include straight-chained or branched $C_1$-$C_6$ alcohols (e.g., methanol, ethanol, propanol, butanol, pentanol, and hexanol), diols and triols. Preferably, the alcohol comprises isopropanol (IPA).

Illustrative surfactants for use in the compositions described herein include, but are not limited to, amphoteric salts, cationic surfactants, anionic surfactants, fluoroalkyl surfactants, non-ionic surfactants, and combinations thereof including, but not limited to, SURFONYL® 104, TRITON® CF-21, ZONYL® UR, ZONYL® FSO-100, ZONYL® FSN-100, 3M Fluorad fluorosurfactants (i.e., FC-4430 and FC-4432), dioctylsulfosuccinate salt, 2,3-dimercapto-1-propanesulfonic acid salt, polyethylene glycols, polypropylene glycols, polyethylene or polypropylene glycol ethers, carboxylic acid salts, $R_1$ benzene sulfonic acids or salts thereof (where the $R_1$ is a straight-chained or branched $C_8$-$C_{18}$ alkyl group), amphiphilic fluoropolymers, polyethylene glycols, polypropylene glycols, polyethylene or polypropylene glycol ethers, $C_8$-$C_{18}$ alkyl phosphate ethers, carboxylic acid salts, alkylaryl sulfonic acids where the alkyl group is a $C_8$-$C_{18}$ alkyl such as dodecylbenzenesulfonic acid, alkylaryl phosphonic acids where the alkyl group is a $C_8$-$C_{18}$ alkyl, polyacrylate polymers, dinonylphenyl polyoxyethylene, silicone or modified silicone polymers, acetylenic diols or modified acetylenic diols, alkylammonium or modified alkylammonium salts, as well as combinations comprising at least one of the foregoing surfactants, sodium dodecyl sulfate, zwitterionic surfactants, aerosol-OT (AOT) and fluorinated analogues thereof, alkyl ammonium, perfluoropolyether surfactants, 2-sulfosuccinate salts, phosphate-based surfactants, sulfur-based surfactants, and acetoacetate-based polymers. In a preferred embodiment, the surfactant includes an alkyl benzene sulfonic acid, more preferably dodecylbenzenesulfonic acid. When present, the amount of surfactant may be in a range from about 0.001 wt % to about 0.5 wt %, based on the total weight of the concentrate.

The optional complexing agents contemplated herein include, but are not limited to, acetic acid, acetone oxime, acrylic acid, adipic acid, alanine, arginine, asparagine, aspartic acid, betaine, dimethyl glyoxime, formic acid, fumaric acid, gluconic acid, glutamic acid, glutamine, glutaric acid, glyceric acid, glycerol, glycolic acid, glyoxylic acid, histidine, iminodiacetic acid, isophthalic acid, itaconic acid, lactic acid, leucine, lysine, maleic acid, maleic anhydride, malic acid, malonic acid, mandelic acid, 2,4-pentanedione, phenylacetic acid, phenylalanine, phthalic acid, proline, propionic acid, pyrocatecol, pyromellitic acid, quinic acid, serine, sorbitol, succinic acid, tartaric acid, terephthalic acid, trimellitic acid, trimesic acid, tyrosine, valine, xylitol, salts and derivatives thereof, and combinations thereof. In a preferred embodiment, preferably the complexing agent comprises histidine.

The pH of the cleaning compositions described herein is greater than 7, preferably in a range from about 10 to greater than 14, more preferably in a range from about 12 to about 14. In a preferred embodiment, the pH of the cleaning composition is greater than 13.

In a particularly preferred embodiment, the cleaning composition comprises, consists of, or consists essentially of tetramethylammonium hydroxide, at least one amine, at least one corrosion inhibitor, and water. For example, the cleaning composition can comprise, consist of or consist essentially of TMAH, at least one alkanolamine, CDTA, an iminodiacetic acid derivative, adenine and water. In another particularly preferred embodiment, the cleaning composition comprises, consists of, or consists essentially of tetramethylammonium hydroxide, at least one amine, at least one corrosion inhibitor, at least one reducing agent, and water. For example, the cleaning composition can comprise, consist of or consist essentially of TMAH, at least one alkanolamine, EDTA, an iminodiacetic acid derivative, adenine, at least one reducing agent, and water, wherein the at least one reducing agent comprises ascorbic acid, gallic acid, or a combination of ascorbic and gallic acids. In another example, the cleaning composition can comprise, consist of or consist essentially of TMAH, N-AEP, adenosine, at least one reducing agent, and water, wherein the at least one reducing agent comprises ascorbic acid, gallic acid, or a combination of ascorbic and gallic acids. In still another preferred embodiment, the cleaning composition comprises, consists of, or consists essentially of tetramethylammonium hydroxide, monoethanolamine, at least one corrosion inhibitor, at least one complexing agent, at least one supplemental corrosion inhibitor, and water. For example, the cleaning composition can comprise, consist of or consist essentially of TMAH, at least one alkanolamine, a diphosphonic acid derivative, adenine, a histidine salt, and water.

With regards to compositional amounts, the weight percent ratios of each component is preferably as follows: about 0.1:1 to about 100:1 quaternary base to corrosion inhibitor, preferably about 10:1 to about 70:1, even more preferably about 25:1 to about 55:1, and most preferably about 45:1 to about 55:1; and about 0.1:1 to about 100:1 organic amine to corrosion inhibitor, preferably about 10:1 to about 70:1, even more preferably about 25:1 to about 55:1, and most preferably about 40:1 to about 50:1. It is possible that the corrosion inhibitor will undergo degradation in the presence of the quaternary base and as such, the weight percent ratios correspond to the concentrate at the time of combination of the quaternary base and the corrosion inhibitor. It will be understood by one skilled in the art that in the event the corrosion inhibitor does undergo degradation, the weight percent may change over time and is monitorable using techniques and mathematical principles known in the art. The concentration of the corrosion inhibitor in the concentrate at the time of combination of the quaternary base and the corrosion inhibitor is in the range of from about 0.001 wt % to about 2 wt %, preferably about 0.001 wt % to about 0.5 wt % and most preferably about 0.1 wt % to about 1.1 wt %.

In another particularly preferred embodiment, the cleaning composition comprises, consists of or consists essentially of tetramethylammonium hydroxide, monoethanolamine, at least one corrosion inhibitor, at least one reducing agent, at least one supplemental corrosion inhibitor, and water, wherein the at least one corrosion inhibitor comprises adenosine, adenosine degradation products, and derivatives thereof. With regards to compositional amounts, the weight percent ratios of each component is preferably as follows: about 0.1:1 to about 100:1 quaternary base to corrosion inhibitor, preferably about 10:1 to about 70:1, even more preferably about 25:1 to about 55:1, and most preferably about 45:1 to about 55:1; about 0.1:1 to about 150:1 organic amine to corrosion inhibitor, preferably about 50:1 to about 120:1, even more preferably about 80:1 to about 100:1, and most preferably about 85:1 to about 95:1; about 1:1 to about 30:1 reducing agent to corrosion inhibitor, preferably about 5:1 to about 15:1; about 1:1 to about 50:1 supplemental corrosion inhibitor to corrosion inhibitor, preferably about 20:1 to about 30:1. For example, the at least one reducing agent may comprise ascorbic acid and the at least one metal inhibitor may comprise 1,2,4-triazole.

The range of weight percent ratios of the components will cover all possible concentrated or diluted embodiments of the composition. Towards that end, in one embodiment, a concentrated cleaning composition is provided that can be diluted for use as a cleaning solution. A concentrated composition, or "concentrate," advantageously permits a user, e.g. CMP process engineer, to dilute the concentrate to the desired strength and pH at the point of use. Dilution of the concentrated cleaning composition may be in a range from about 1:1 to about 2500:1, preferably about 5:1 to about 200:1, and most preferably about 10:1 to about 50:1, wherein the cleaning composition is diluted at or just before the tool with solvent, e.g., deionized water. It is to be appreciated by one skilled in the art that following dilution, the range of weight percent ratios of the components disclosed herein should remain unchanged.

The compositions described herein may have utility in applications including, but not limited to, post-etch residue removal, post-ash residue removal surface preparation, post-plating cleaning and post-CMP residue removal. In addition, it is contemplated that the cleaning compositions described herein may be useful for the cleaning and protection of other metal (e.g., copper-containing) products including, but not limited to, decorative metals, metal wire bonding, printed circuit boards and other electronic packaging using metal or metal alloys.

In yet another preferred embodiment, the cleaning compositions described herein further include residue and/or contaminants. The residue and contaminants may be dissolved and/or suspended in the compositions. Preferably, the residue includes post-CMP residue, post-etch residue, post-ash residue, contaminants, or combinations thereof.

The cleaning compositions are easily formulated by simple addition of the respective ingredients and mixing to homogeneous condition. Furthermore, the compositions may be readily formulated as single-package formulations or multi-part formulations that are mixed at or before the point of use, e.g., the individual parts of the multi-part formulation may be mixed at the tool or in a storage tank upstream of the tool. The concentrations of the respective ingredients may be widely varied in specific multiples of the composition, i.e., more dilute or more concentrated, and it will be appreciated that the compositions described herein can variously and alternatively comprise, consist or consist essentially of any combination of ingredients consistent with the disclosure herein.

In another embodiment of the cleaning compositions described herein, the composition further comprises ammonium hydroxide or $NR^1R^2R^3R^4OH$, where $R^1$, $R^2$, $R^3$ and $R^4$ can be the same as or different from one another and are selected from the group consisting of H, a methyl and an ethyl group, with the proviso that at least one of $R^1$, $R^2$, $R^3$ and $R^4$ must be H. Preferably, the additional hydroxide is added to the cleaning composition at the point of use.

Accordingly, another aspect relates to a kit including, in one or more containers, one or more components adapted to form the compositions described herein. The kit may include, in one or more containers, at least one corrosion inhibitor, at least one quaternary base, at least one alkanolamine, and optionally at least one additional species selected from the group consisting of at least one reducing agent, at least one complexing agent, at least one supplemental corrosion inhibitor, at least one alcohol, and at least one surfactant, for combining with additional solvent, e.g., water and/or $NR^1R^2R^3R^4OH$ (as defined above), at the fab or the point of use. Alternatively, the kit may include, in a first container at least one corrosion inhibitor, and in a second container at least one quaternary base, at least one alkanolamine, and optionally at least one additional species selected from the group consisting of at least one reducing agent, at least one complexing agent, at least one supplemental corrosion inhibitor, at least one alcohol, and at least one surfactant, for combining with each other and additional solvent, e.g., water and/or $NR^1R^2R^3R^4OH$ (as defined above), at the fab or the point of use. The containers of the kit must be suitable for storing and shipping said removal compositions, for example, NOWPak® containers (Advanced Technology Materials, Inc., Danbury, Conn., USA).

The one or more containers which contain the components of the removal composition preferably include means for bringing the components in said one or more containers in fluid communication for blending and dispense. For example, referring to the NOWPak® containers, gas pressure may be applied to the outside of a liner in said one or more containers to cause at least a portion of the contents of the liner to be discharged and hence enable fluid communication for blending and dispense. Alternatively, gas pressure may be applied to the head space of a conventional pressurizable container or a pump may be used to enable fluid communication. In addition, the system preferably includes a dispensing port for dispensing the blended removal composition to a process tool.

Substantially chemically inert, impurity-free, flexible and resilient polymeric film materials, such as high density polyethylene, are preferably used to fabricate the liners for said one or more containers. Desirable liner materials are processed without requiring co-extrusion or barrier layers, and without any pigments, UV inhibitors, or processing agents that may adversely affect the purity requirements for components to be disposed in the liner. A listing of desirable liner materials include films comprising virgin (additive-free) polyethylene, virgin polytetrafluoroethylene (PTFE), polypropylene, polyurethane, polyvinylidene chloride, polyvinylchloride, polyacetal, polystyrene, polyacrylonitrile, polybutylene, and so on. Preferred thicknesses of such liner materials are in a range from about 5 mils (0.005 inch) to about 30 mils (0.030 inch), as for example a thickness of 20 mils (0.020 inch).

Regarding the containers for the kits, the disclosures of the following patents and patent applications are hereby incorporated herein by reference in their respective entireties: U.S. Pat. No. 7,188,644 entitled "APPARATUS AND METHOD FOR MINIMIZING THE GENERATION OF PARTICLES IN ULTRAPURE LIQUIDS;" U.S. Pat. No. 6,698,619 entitled "RETURNABLE AND REUSABLE, BAG-IN-DRUM FLUID STORAGE AND DISPENSING CONTAINER SYSTEM;" U.S. Publication No. 20100128555 entitled "SYSTEMS AND METHODS FOR MATERIAL BLENDING AND DISTRIBUTION" published on May 27, 2010 in the name of John E.Q. Hughes, and PCT/US08/63276 entitled "SYSTEMS AND METHODS FOR MATERIAL BLENDING AND DISTRIBUTION" filed on May 9, 2008 in the name of Advanced Technology Materials, Inc.

As applied to microelectronic manufacturing operations, the cleaning compositions described herein are usefully employed to clean post-CMP residue and/or contaminants from the surface of the microelectronic device. The cleaning compositions do not damage low-k dielectric materials or corrode metal interconnects on the device surface. Preferably the cleaning compositions remove at least 85% of the residue present on the device prior to residue removal, more preferably at least 90%, even more preferably at least 95%, and most preferably at least 99%.

In post-CMP residue and contaminant cleaning application, the cleaning composition may be used with a large variety of conventional cleaning tools such as megasonics and brush scrubbing, including, but not limited to, Verteq single wafer megasonic Goldfinger, OnTrak systems DDS (double-sided scrubbers), SEZ or other single wafer spray rinse, Applied Materials Mirra-Mesa™/Reflexion™/Reflexion LK™, and Megasonic batch wet bench systems.

In use of the compositions described herein for cleaning post-CMP residue, post-etch residue, post-ash residue and/or contaminants from microelectronic devices having same thereon, the cleaning composition typically is contacted with the device for a time of from about 5 sec to about 10 minutes, preferably about 1 sec to 20 min, preferably about 15 sec to about 5 min at temperature in a range of from about 20° C. to about 90° C., preferably about 20° C. to about 50° C. Such contacting times and temperatures are illustrative, and any other suitable time and temperature conditions may be employed that are efficacious to at least partially clean the post-CMP residue/contaminants from the device, within the broad practice of the method. "At least partially clean" and "substantial removal" both correspond to at removal of at least 85% of the residue present on the device prior to residue removal, more preferably at least 90%, even more preferably at least 95%, and most preferred at least 99%

Following the achievement of the desired cleaning action, the cleaning composition may be readily removed from the device to which it has previously been applied, as may be desired and efficacious in a given end use application of the compositions described herein. Preferably, the rinse solution includes deionized water. Thereafter, the device may be dried using nitrogen or a spin-dry cycle.

Yet another aspect relates to the improved microelectronic devices made according to the methods described herein and to products containing such microelectronic devices.

Another aspect relates to a recycled cleaning composition, wherein the cleaning composition may be recycled until residue and/or contaminant loading reaches the maximum amount the cleaning composition may accommodate, as readily determined by one skilled in the art.

A still further aspect relates to methods of manufacturing an article comprising a microelectronic device, said method comprising contacting the microelectronic device with a cleaning composition for sufficient time to clean post-CMP residue and contaminants from the microelectronic device having said residue and contaminants thereon, and incorporating said microelectronic device into said article, using a cleaning composition described herein.

In another aspect, a method of removing post-CMP residue and contaminants from a microelectronic device having same thereon is described, said method comprising:
  polishing the microelectronic device with a CMP slurry;
  contacting the microelectronic device with a cleaning composition comprising at least one corrosion inhibitor, for a sufficient time to remove post-CMP residue and contaminants from the microelectronic device to form a post-CMP residue-containing composition; and
  continuously contacting the microelectronic device with the post-CMP residue-containing composition for a sufficient amount of time to effect substantial cleaning of the microelectronic device,
wherein the at least one corrosion inhibitor comprises a species selected from the group consisting of ribosylpurines and methylated or deoxy derivatives thereof; degradation products of adenosine and adenosine derivatives; purine-saccharide complexes; other purine compounds and methylated or deoxy derivatives thereof; and combinations thereof.

Another aspect relates to an article of manufacture comprising a cleaning composition, a microelectronic device wafer, and material selected from the group consisting of residue, contaminants and combinations thereof, wherein the cleaning composition comprises at least one solvent, at least one corrosion inhibitor, at least one amine, and at least one quaternary base, wherein the at least one corrosion inhibitor comprises a species selected from the group consisting of ribosylpurines and methylated or deoxy derivatives thereof; degradation products of adenosine and adenosine derivatives; purine-saccharide complexes; other purine compounds and methylated or deoxy derivatives thereof; and combinations thereof, and wherein the residue comprises at least one of post-CMP residue, post-etch residue and post-ash residue.

The features and advantages are more fully shown by the illustrative examples discussed below.

EXAMPLE 1

A composition including 5 wt % TMAH, 4.5 wt % MEA, 2.4 wt % adenosine and 87.1 wt % water was aged at 80° C. and using mass spectrometry it was determined that the adenosine related materials decreased or disappeared and adenine related materials were produced in their place. Although not wishing to be bound by theory, it is hypothesized that the adenosine degrades to form adenine and ribose and the adenosine, adenine and ribose are methylated during the degradation process. The adenine and ribose may undergo further degradation. In addition, dimers may form.

EXAMPLE 2

Figure 1:
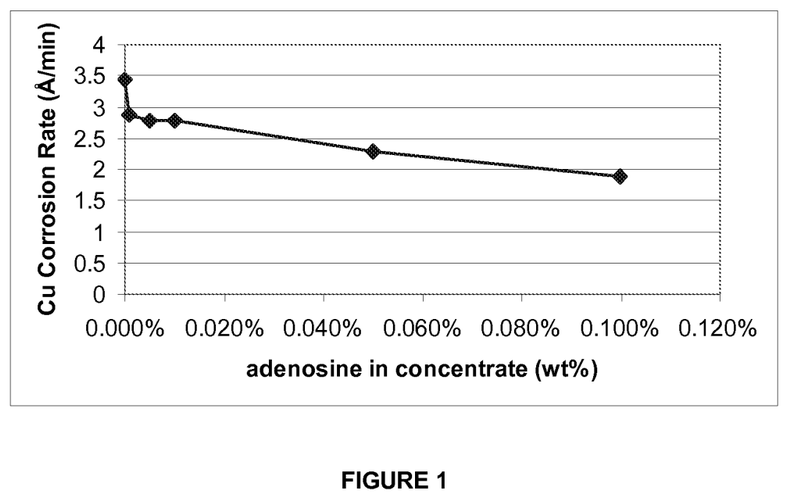
FIG. 1 is a plot of the copper corrosion rates in Å per minute as a function of the weight % of adenosine in the concentrate.

Cleaning composition concentrates including 5 wt % TMAH, 4.5 wt % MEA and the weight percent of adenosine and water indicated in Table 1 were prepared for immediate use. The concentrates were diluted 30:1 with water (water to concentrate) and the corrosion rate of copper determined by statically immersing blanketed ECD copper wafers in each composition at 25° C. The copper corrosion results are tabulated in Table 1 and the corrosion rates are illustrated in FIG. 1.

TABLE 1

Copper corrosion rates in diluted cleaning compositions

| Formulation | in concentrate adenosine | in concentrate water | upon 30:1 dilution ppm adenosine | Cu corrosion rate/Å min$^{-1}$ | standard deviation |
|---|---|---|---|---|---|
| A | 0.000 wt % | 90.5 wt % | 0 | 3.44 | 0.014142 |
| B | 0.001 wt % | 90.499 wt % | 0.33 | 2.88 | 0.028284 |
| C | 0.005 wt % | 90.495 wt % | 1.67 | 2.78 | 0.113137 |
| D | 0.010 wt % | 90.490 wt % | 3.33 | 2.785 | 0.233345 |
| E | 0.050 wt % | 90.450 wt % | 16.67 | 2.275 | 0.049497 |
| F | 0.100 wt % | 90.400 wt % | 33.33 | 1.885 | 0.021213 |

EXAMPLE 3

Figure 2:
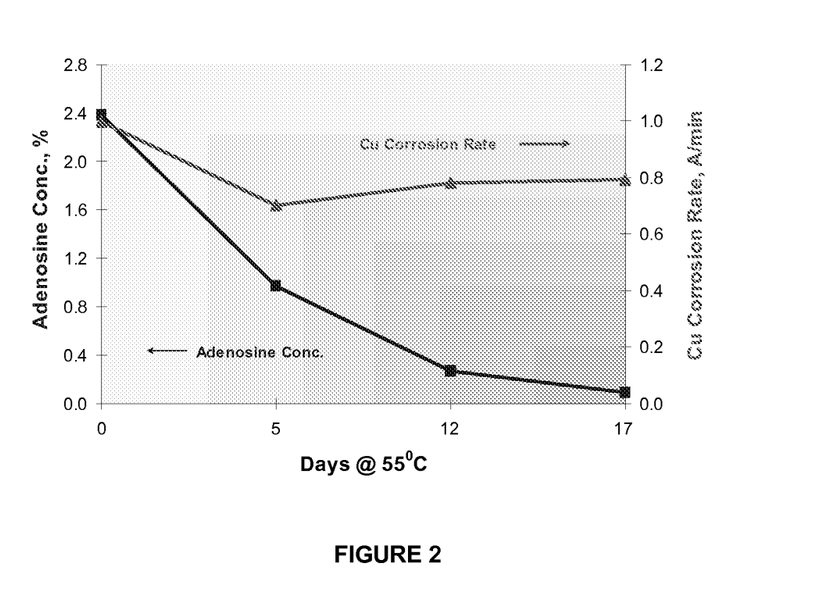
FIG. 2 is a plot of the copper corrosion rates in Å per minute as a function of the adenosine concentration in weight percent and the number of days the concentrate has been aged at 55° C.

Cleaning composition concentrates including 5 wt % TMAH, 4.5 wt % MEA 2.4 wt % adenosine, and 88.1 wt % water (Formulation P) were prepared. The concentrates were aged at 55° C. for 17 days and periodically samples were withdrawn to monitor the concentration of adenosine in the composition as well as determine the corrosion rate of copper when contacted with said sample. Corrosion rates were determined by statically immersing blanketed ECD copper wafers in each withdrawn sample at 25° C. Adenosine concentrations in the withdrawn samples were determined using high-performance liquid chromatography (HPLC). The adenosine concentration in weight percent and the copper corrosion rates are illustrated in FIG. 2.

EXAMPLE 4

Cleaning composition concentrate F from Example 1 and Concentrate G (9 wt % MEA, 5 wt % TMAH, 3.5 wt % ascorbic acid, and 82.50 wt % water) were prepared. Blanketed ECD copper wafers were contacted serially as follows: 15 sec chemistry, 15 sec rinse in brush box 1 with DI water, 60 sec chemistry, and 15 sec rinse in brush box 2 with DI water. The chemistries used were (a) Formulation H, which is a 60:1 dilution of concentrate F, (b) Formulation I, which is a 60:1 dilution of aged concentrate F (aged overnight at 80° C.), or (c) Formulation J, which is a 60:1 dilution of concentrate G. Each resulted in approximately the same defect count on the wafer, as determined using Atomic Force Microscopy. The age of the formulation had no significant impact on the defect count. That said, comparing the roughness (in haze numbers) following the serial contact using Formulations H and J, it was determined that the haze numbers using Formulation H were almost 50% less than those using Formulation J.

EXAMPLE 5

Blanketed BLACK DIAMOND (BD) wafers were statically immersed in formulation H, formulation K (a 30:1 dilution of concentrate F), formulation I, and formulation L (a 30:1 dilution of aged concentrate F (aged overnight at 80° C.)) for 5 minutes at 25° C., followed by rinsing with DI water for 2 minutes at 25° C., and the dielectric constant of the BD determined. No substantial change in the dielectric constant of the BD wafers was observed.

Blanketed ECD copper wafers were statically or dynamically immersed (stirring at 3000 rpm) in Formulations H, K, I and L for 5 minutes at 25° C., followed by rinsing with DI water for 2 minutes at 25° C., and the corrosion rate of copper determined. The lowest corrosion rates observed were for formulation H (dynamic) and formulation I (static).

Sematech 854 wafers were dynamically immersed (stirring at 3000 rpm) in Formulations H, K, I and L for 5 minutes at 25° C., followed by rinsing with DI water for 2 minutes at 25° C., and the cleaning efficiency determined using AFM. All of the formulations displayed substantially the same cleaning efficacy.

EXAMPLE 6

The following formulations were prepared:
Formulation M: 5 wt % TMAH, 2.79 wt % TEPA, 0.1 wt % adenosine, 92.11 wt % water
Formulation N: 5 wt % TMAH, 3.17 wt % N-AEP, 0.1 wt % adenosine, 91.73 wt % water
Formulation O: 5 wt % TMAH, 9.70 wt % HEM, 0.1 wt % adenosine, 86.20 wt % water Formulations F, M, N and O were diluted 30:1 with water and blanketed ECD copper wafers were dynamically immersed (50 rps) for 300 sec in each diluted formulation at 25° C., followed by rinsing in DI water for 120 sec at 25° C. The corrosion rate of copper was determined for each, as provided in Table 2 below.

TABLE 2

Copper corrosion rates in diluted Formulations F, M, N and O

| 30:1 diluted formulation | Cu Corrosion rate/Å min$^{-1}$ |
|---|---|
| F | 1.896 |
| M | 4.668 |
| N | 1.088 |
| O | 1.125 |

It can be seen that amines other than MEA may be used in the cleaning compositions disclosed herein with similar copper corrosion rate results.

EXAMPLE 7

It was determined if sacrificial anti-oxidants could be added to the cleaning compositions disclosed herein to slow the degradation of adenosine corrosion inhibitor, therefore extending the shelf-life of the cleaning composition.

Formulation P was modified to include 0.1 wt % of lipoic acid or ascorbic acid (with a concomitant decrease in the amount of water present) and maintained at 55° C. for 4 days. The concentration of adenosine at the end of the experiment was less than 0.1 wt %, indicating that the adenosine still underwent degradation.

A second experiment was run whereby compositions where formulated having the same molar amount of adenosine and lipoic acid or ascorbic acid. The compositions were roughly those of formulation P. The compositions including the lipoic acid and the ascorbic acid were aged at 80° C. for 0, 2, 4, 8, 16 and 24 hours. According to HPLC results, the lipoic acid and ascorbic acid slowed the rate of decomposition over time.

Although the invention has been variously disclosed herein with reference to illustrative embodiments and features, it will be appreciated that the embodiments and features described hereinabove are not intended to limit the invention, and that other variations, modifications and other embodiments will suggest themselves to those of ordinary skill in the art, based on the disclosure herein. The invention therefore is to be broadly construed, as encompassing all such variations, modifications and alternative embodiments within the spirit and scope of the claims hereafter set forth.

What is claimed is:

1. A cleaning composition comprising at least one solvent, at least one corrosion inhibitor, at least one amine, and at least one quaternary base, wherein the corrosion inhibitor comprises a species selected from the group consisting of: N-ribosylpurine, guanosine, 2-aminopurine riboside, 2-methoxyadenosine, N-methyladenosine, N,N-dimethyladenosine, trimethylated adenosine, trimethyl N-methyladenosine, C-4'-methyladenosine, 3-deoxyadenosine, methylated adenine, dimethylated adenine, N4,N4-dimethylpyrimidine-4,5,6-triamine, 4,5,6-triaminopyrimidine, allantoin, hydroxylated C—O—O—C dimers, C—C bridged dimers, ribose, methylated ribose, tetramethylated ribose, xylose, glucose, triaminopyrimidine, amino-substituted pyrimidines, and combinations thereof, and wherein the cleaning composition is substantially devoid of corrosion inhibiting metal halides.

2. A kit comprising, in one or more containers, one or more of the following reagents for forming a cleaning composition, wherein the cleaning composition comprises at least one solvent, at least one corrosion inhibitor, at least one amine, and at least one quaternary base, wherein the corrosion inhibitor comprises a species selected from the group consisting of: N-ribosylpurine, guanosine, 2-aminopurine riboside, 2-methoxyadenosine, N-methyladenosine, N,N-dimethyladenosine, trimethylated adenosine, trimethyl N-methyladenosine, C-4'-methyladenosine, 3-deoxyadenosine, methylated adenine, dimethylated adenine, N4,N4-dimethylpyrimidine-4,5,6-triamine, 4,5,6-triaminopyrimidine, allantoin, hydroxylated C—O—O—C dimers, C—C bridged dimers, ribose, methylated ribose, tetramethylated ribose, xylose, glucose, triaminopyrimidine, amino-substituted pyrimidines, and combinations thereof, and wherein the cleaning composition is substantially devoid of corrosion inhibiting metal halides.

3. A method of removing residue and contaminants from a microelectronic device having said residue and contaminants thereon, said method comprising contacting the microelectronic device with a cleaning composition for sufficient time to at least partially clean said residue and contaminants from the microelectronic device, wherein the cleaning composition includes at least one solvent, at least one corrosion inhibitor, at least one amine, and at least one quaternary base, wherein the corrosion inhibitor comprises a species selected from the group consisting of: N-ribosylpurine, guanosine, 2-aminopurine riboside, 2-methoxyadenosine, N-methyladenosine, N,N-dimethyladenosine, trimethylated adenosine, trimethyl N-methyladenosine, C-4'-methyladenosine, 3-deoxyadenosine, methylated adenine, dimethylated adenine, N4,N4-dimethylpyrimidine-4,5,6-triamine, 4,5,6-triaminopyrimidine, allantoin, hydroxylated C—O—O—C dimers, C—C bridged dimers, ribose, methylated ribose, tetramethylated ribose, xylose, glucose, triaminopyrimidine, amino-substituted pyrimidines, and combinations thereof, and wherein the cleaning composition is substantially devoid of corrosion inhibiting metal halides.

4. The method of claim 3, further comprising diluting the cleaning composition with solvent at or before a point of use, wherein said solvent comprises water.

5. The method of claim 3, wherein the at least one quaternary base has the formula $NR^1R^2R^3R^4OH$, wherein $R^1$, $R^2$, $R^3$ and $R^4$ may be the same as or different from one another and are selected from the group consisting of hydrogen, straight-chained $C_1$-$C_6$ alkyl, branched $C_1$-$C_6$ alkyl, substituted $C_6$-$C_{10}$ aryl, and unsubstituted $C_6$-$C_{10}$ aryl.

6. The method of claim 3, wherein the solvent comprises water.

7. The method of claim 3, wherein the cleaning composition further comprises residue and contaminants, wherein the residue comprises post-CMP residue, post-etch residue, post-ash residue, or combinations thereof.

8. The method of claim 3, wherein the composition is diluted in a range from about 5:1 to about 200:1.

9. The method of claim 3, wherein the composition is substantially devoid of at least one of oxidizing agents; fluoride-containing sources; abrasive materials; an alcohol having an ether-bond in the molecule; alkylpyrrolidones; surface interaction enhancing agents; alkali and alkaline earth metal bases; sugar alcohols; and combinations thereof; and wherein the cleaning compositions do not solidify to form a polymeric solid.

10. The method of claim 3, wherein the amine comprises at least one species selected from the group consisting of aminoethylethanolamine, N-methylaminoethanol, aminoethoxyethanol, dimethylaminoethoxyethanol, diethanolamine, N-methyldiethanolamine, monoethanolamine, triethanolamine, 1-amino-2-propanol, 2-amino-1-butanol, isobutanolamine, triethylenediamine, other $C_1$-$C_8$ alkanolamines, tetraethylenepentamine (TEPA), 4-(2-hydroxyethyl)morpholine (HEM), N-aminoethylpiperazine (N-AEP), ethylenediaminetetraacetic acid (EDTA), 1,2-cyclohexanediamine-N,N,N',N'-tetraacetic acid (CDTA), glycine/ascorbic acid, iminodiacetic acid (IDA), 2-(hydroxyethyl)iminodiacetic acid (HIDA), nitrilotriacetic acid, thiourea, 1,1,3,3-tetramethylurea, urea, urea derivatives, uric acid, glycine, alanine, arginine, asparagine, aspartic acid, cysteine, glutamic acid, glutamine, histidine, isoleucine, leucine, lysine, methionine, phenylalanine, proline, serine, threonine, tryptophan, tyrosine, valine, 1-methoxy-2-aminoethane, and combinations thereof.

11. The method of claim 3, wherein the cleaning composition further comprises at least one additional component selected from the group consisting of at least one reducing agent, at least one complexing agent, at least one supplemental corrosion inhibitor, at least one alcohol, at least one surfactant, and $NR^1R^2R^3R^4OH$, where $R^1$, $R^2$, $R^3$ and $R^4$ can be the same as or different from one another and are selected from the group consisting of H, a methyl and an ethyl group, with the proviso that at least one of $R^1$, $R^2$, $R^3$ and $R^4$ must be H.

12. The method of claim 3, wherein the cleaning composition further comprises at least one reducing agent, wherein the at least one reducing agent comprises a species selected from the group consisting of ascorbic acid, L(+)-ascorbic acid, isoascorbic acid, ascorbic acid derivatives, gallic acid, glyoxal, and combinations thereof.

13. The method of claim 3, wherein the cleaning composition further comprises at least one complexing agent and at least one supplemental corrosion inhibitor, wherein the supplemental corrosion inhibitor comprises a species selected from the group consisting of ascorbic acid, L(+)-ascorbic acid, isoascorbic acid, ascorbic acid derivatives, benzotriazole, citric acid, ethylenediamine, gallic acid, oxalic acid, tannic acid, 1,2,4-triazole (TAZ), tolyltriazole, 5-phenyl-benzotriazole, 5-nitro-benzotriazole, 3-amino-5-mercapto-1,2,4-triazole, 1-amino-1,2,4-triazole, hydroxybenzotriazole, 2-(5-amino-pentyl)-benzotriazole, 1,2,3-triazole, 1-amino-1,2,3-triazole, 1-amino-5-methyl-1,2,3-triazole, 3-amino-1,2,4-triazole, 3-mercapto-1,2,4-triazole, 3-isopropyl-1,2,4-triazole, 5-phenylthiol-benzotriazole, halo-benzotriazoles (halo=F, Cl, Br, I), naphthotriazole, 2-mercaptobenzimidazole (MBI), 2-mercaptobenzothiazole, 4-methyl-2-phenylimidazole, 2-mercaptothiazoline, 5-aminotetrazole, 5-amino-1,3,4-thiadiazole-2-thiol, 2,4-diamino-6-methyl-1,3,5-triazine, thiazole, triazine, methyltetrazole, 1,3-dimethyl-2-imidazolidinone, 1,5-pentamethylenetetrazole, 1-phenyl-5-mercaptotetrazole, diaminomethyltriazine, imidazoline thione, mercaptobenzimidazole, 4-methyl-4H-1,2,4-triazole-3-thiol, 5-amino-1,3,4-thiadiazole-2-thiol, benzothiazole, tritolyl phosphate, imidazole, indiazole, benzoic acid, ammonium benzoate, catechol, pyrogallol, resorcinol, hydroquinone, cyanuric acid, barbituric acid and derivatives such as 1,2-dimethylbarbituric acid, pyruvic acid, phosphonic acid and derivatives thereof, 1-hydroxyethylidene-1,1-diphosphonic acid (HEDP), propanethiol, benzohydroxamic acids, heterocyclic nitrogen inhibitors, potassium ethylxanthate, and combinations thereof, and wherein the complexing agent comprises a species selected from the group consisting of acetic acid, acetone oxime, acrylic acid, adipic acid, alanine, arginine, asparagine, aspartic acid, betaine, dimethyl glyoxime, formic acid, fumaric acid, gluconic acid, glutamic acid, glutamine, glutaric acid, glyceric acid, glycerol, glycolic acid, glyoxylic acid, histidine, iminodiacetic acid, isophthalic acid, itaconic acid, lactic acid, leucine, lysine, maleic acid, maleic anhydride, malic acid, malonic acid, mandelic acid, 2,4-pentanedione, phenylacetic acid, phenylalanine, phthalic acid, proline, propionic acid, pyrocatecol, pyromellitic acid, quinic acid, serine, sorbitol, succinic acid, tartaric acid, terephthalic acid, trimellitic acid, trimesic acid, tyrosine, valine, xylitol, salts and derivatives thereof, and combinations thereof.

14. The cleaning composition of claim 1, wherein the at least one quaternary base has the formula $NR^1R^2R^3R^4OH$, wherein $R^1$, $R^2$, $R^3$ and $R^4$ may be the same as or different from one another and are selected from the group consisting of hydrogen, straight-chained $C_1$-$C_6$ alkyl, branched $C_1$-$C_6$ alkyl, substituted $C_6$-$C_{10}$ aryl, and unsubstituted $C_6$-$C_{10}$ aryl.

15. The cleaning composition of claim 1, wherein the solvent comprises water.

16. The cleaning composition of claim 1, wherein the amine comprises at least one species selected from the group consisting of aminoethylethanolamine, N-methylaminoethanol, aminoethoxyethanol, dimethylaminoethoxyethanol, diethanolamine, N-methyldiethanolamine, monoethanolamine, triethanolamine, 1-amino-2-propanol, 2-amino-1-butanol, isobutanolamine, triethylenediamine, other $C_1$-$C_8$ alkanolamines, tetraethylenepentamine (TEPA), 4-(2-hydroxyethyl)morpholine (HEM), N-aminoethylpiperazine (N-AEP), ethylenediaminetetraacetic acid (EDTA), 1,2-cyclohexanediamine-N,N,N',N'-tetraacetic acid (CDTA), glycine/ascorbic acid, iminodiacetic acid (IDA), 2-(hydroxyethyl)iminodiacetic acid (HIDA), nitrilotriacetic acid, thiourea, 1,1,3,3-tetramethylurea, urea, urea derivatives, uric acid, glycine, alanine, arginine, asparagine, aspartic acid, cysteine, glutamic acid, glutamine, histidine, isoleucine, leucine, lysine, methionine, phenylalanine, proline, serine, threonine, tryptophan, tyrosine, valine, 1-methoxy-2-aminoethane, and combinations thereof.

17. The cleaning composition of claim 1, wherein the composition is substantially devoid of at least one of oxidizing agents; fluoride-containing sources; abrasive materials; an alcohol having an ether-bond in the molecule; alkylpyrrolidones; surface interaction enhancing agents; alkali and alkaline earth metal bases; sugar alcohols; and combinations thereof; and wherein the cleaning compositions do not solidify to form a polymeric solid.

18. The cleaning composition of claim 1, further comprising at least one additional component selected from the group consisting of at least one reducing agent, at least one complexing agent, at least one supplemental corrosion inhibitor, at least one alcohol, at least one surfactant, and $NR^1R^2R^3R^4OH$, where $R^1$, $R^2$, $R^3$ and $R^4$ can be the same as or different from one another and are selected from the group consisting of H, a methyl and an ethyl group, with the proviso that at least one of $R^1$, $R^2$, $R^3$ and $R^4$ must be H.

19. The cleaning composition of claim 1, further comprising at least one reducing agent, wherein the at least one reducing agent comprises a species selected from the group consisting of ascorbic acid, L(+)-ascorbic acid, isoascorbic acid, ascorbic acid derivatives, gallic acid, glyoxal, and combinations thereof.

20. The cleaning composition of claim 1, further comprising at least one complexing agent and at least one supplemental corrosion inhibitor, wherein the supplemental corrosion inhibitor comprises a species selected from the group consisting of ascorbic acid, L(+)-ascorbic acid, isoascorbic acid, ascorbic acid derivatives, benzotriazole, citric acid, ethylenediamine, gallic acid, oxalic acid, tannic acid, 1,2,4-triazole (TAZ), tolyltriazole, 5-phenyl-benzotriazole, 5-nitro-benzotriazole, 3-amino-5-mercapto-1,2,4-triazole, 1-amino-1,2,4-triazole, hydroxybenzotriazole, 2-(5-amino -pentyl)-benzotriazole, 1,2,3-triazole, 1-amino-1,2,3-triazole, 1-amino-5-methyl-1,2,3-triazole, 3-amino-1,2,4-triazole, 3-mercapto-1,2,4-triazole, 3-isopropyl-1 ,2,4-triazole, 5-phenylthiol-benzotriazole, halo-benzotriazoles (halo=F, Cl, Br, I), naphthotriazole, 2-mercaptobenzimidazole (MBI), 2-mercaptobenzothiazole, 4-methyl-2-phenylimidazole, 2-mercaptothiazoline, 5-aminotetrazole, 5-amino-1,3,4-thiadiazole-2-thiol, 2,4-diamino-6-methyl-1,3,5-triazine, thiazole, triazine, methyltetrazole, 1,3-dimethyl-2-imidazolidinone, 1,5-pentamethylenetetrazole, 1-phenyl-5-mercaptotetrazole, diaminomethyltriazine, imidazoline thione, mercaptobenzimidazole, 4-methyl-4H-1,2,4-triazole-3-thiol, 5-amino-1,3,4-thiadiazole-2-thiol, benzothiazole, tritolyl phosphate, imidazole, indiazole, benzoic acid, ammonium benzoate, catechol, pyrogallol, resorcinol, hydroquinone, cyanuric acid, barbituric acid and derivatives such as 1,2-dimethylbarbituric acid, pyruvic acid, phosphonic acid and derivatives thereof, 1-hydroxyethylidene-1,1-diphosphonic acid (HEDP), propanethiol, benzohydroxamic acids, heterocyclic nitrogen inhibitors, potassium ethylxanthate, and combinations thereof, and wherein the complexing agent comprises a species selected from the group consisting of acetic acid, acetone oxime, acrylic acid, adipic acid, alanine, arginine, asparagine, aspartic acid, betaine, dimethyl glyoxime, formic acid, fumaric acid, gluconic acid, glutamic acid, glutamine, glutaric acid, glyceric acid, glycerol, glycolic acid, glyoxylic acid, histidine, iminodiacetic acid, isophthalic acid, itaconic acid, lactic acid, leucine, lysine, maleic acid, maleic anhydride, malic acid, malonic acid, mandelic acid, 2,4-pentanedione, phenylacetic acid, phenylalanine, phthalic acid, proline, propionic acid, pyrocatecol, pyromellitic acid, quinic acid, serine, sorbitol, succinic acid, tartaric acid, terephthalic acid, trimellitic acid, trimesic acid, tyrosine, valine, xylitol, salts and derivatives thereof, and combinations thereof.

21. The cleaning composition of claim 14, wherein the at least one quaternary base is selected from the group consisting of tetraethylammonium hydroxide (TEAH), tetramethyammonium hydroxide (TMAH), tetrapropylammonium hydroxide (TPAH), tetrabutylammonium hydroxide (TBAH), tributylmethylammonium hydroxide (TBMAH), benzyltrimethylammonium hydroxide (BTMAH), and combinations thereof.

22. The method of claim 5, wherein the at least one quaternary base is selected from the group consisting of tetraethylammonium hydroxide (TEAH), tetramethylammonium (TMAH), tetrapropylammonium hydroxide (TPAH), tetrabutylammonium hydroxide (TBAH), tributylmethylammonium hydroxide (TBMAH), benzyltrimethylammonium hydroxide (BTMAH), and combinations thereof.

* * * * *